United States Patent [19]

Marks et al.

[11] Patent Number: 4,551,912
[45] Date of Patent: Nov. 12, 1985

[54] HIGHLY INTEGRATED UNIVERSAL TAPE BONDING

[75] Inventors: Robert Marks, So. Burlington; Douglas W. Phelps, Jr., Burlington; Sigvart J. Samuelsen, Burlington; William C. Ward, Burlington, all of Vt.

[73] Assignee: International Business Machines Corporation, Armonk, N.Y.

[21] Appl. No.: 718,817

[22] Filed: Apr. 1, 1985

Related U.S. Application Data

[63] Continuation of Ser. No. 509,507, Jun. 30, 1983, abandoned.

[51] Int. Cl.⁴ .............................. H01L 21/60
[52] U.S. Cl. ........................ 29/576 S; 29/589; 29/591
[58] Field of Search ............ 29/594, 576 S, 589, 29/591

[56] References Cited

U.S. PATENT DOCUMENTS

| 3,698,075 | 10/1972 | Boyle | 29/589 X |
| 3,709,424 | 1/1973 | Drees | 29/589 X |
| 3,761,675 | 9/1973 | Mason et al. | 219/121 LM |
| 3,793,714 | 2/1974 | Bylander | 29/589 X |
| 3,903,363 | 9/1975 | Montone et al. | 358/101 |
| 4,209,355 | 6/1980 | Burns | 29/576 S X |
| 4,396,457 | 8/1983 | Bakermans | 29/576 S X |

FOREIGN PATENT DOCUMENTS 0118345 9/1981 Japan .................. 29/576 S

Primary Examiner—Brian E. Hearn
Assistant Examiner—Alan E. Schiavelli
Attorney, Agent, or Firm—Sughrue, Mion, Zinn, Macpeak, and Seas

[57] ABSTRACT

A method of forming semiconductor devices wherein a continuous metallic sheet is cut under computer control into a personalized lead pattern. The pattern is then moved to a bonding station. A bonding tool actuated by computer control moves from one terminal end to another to sequentially bond terminals to the semiconductor device. A variety of various patterns and chips can be handled on the same line using common cutting and bonding tools. A second bond can be made from the lead pattern to either a lead frame or a substrate.

12 Claims, 5 Drawing Figures

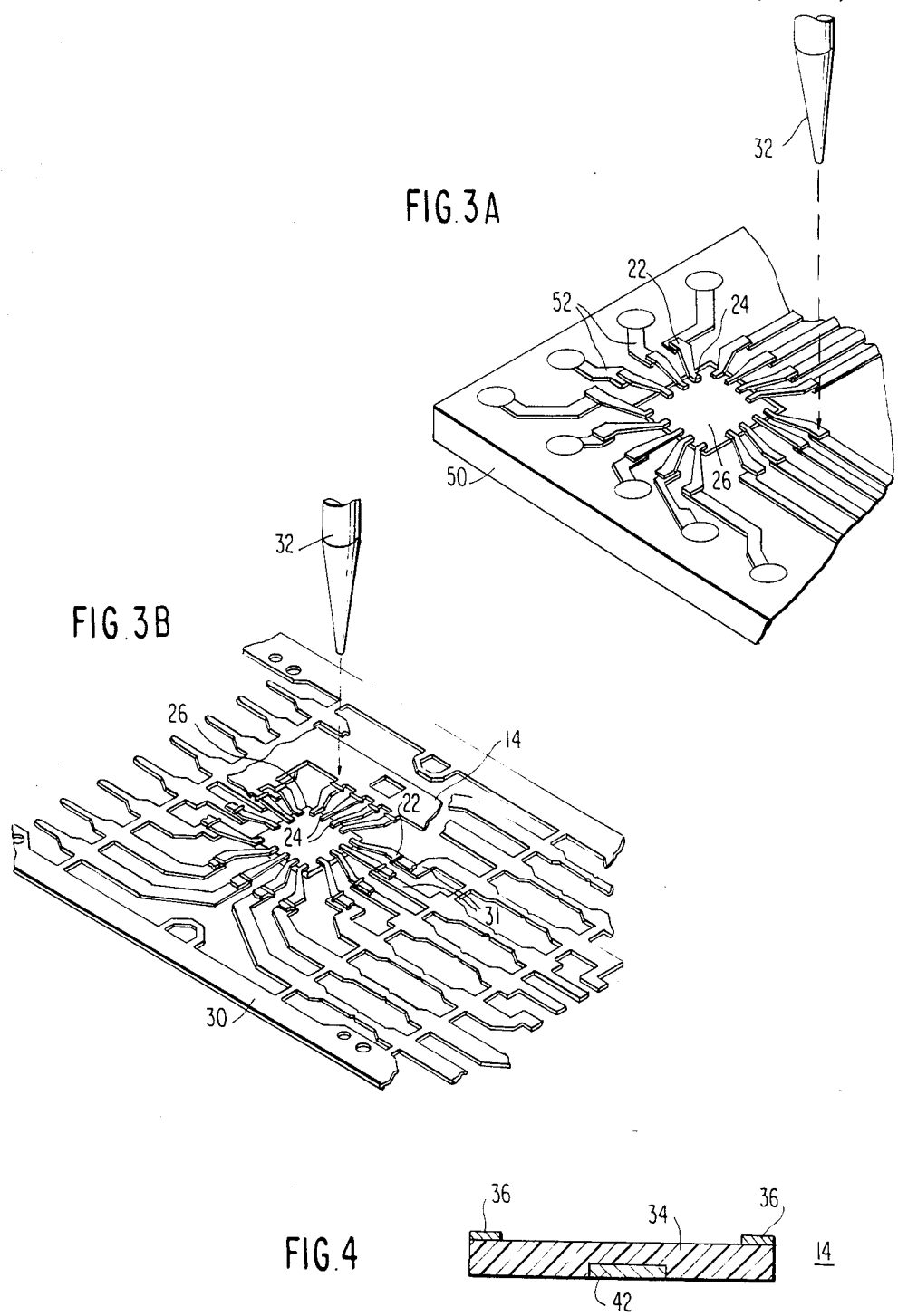

HIGHLY INTEGRATED UNIVERSAL TAPE BONDING

This is a continuation of Ser. No. 509,507, now abandoned.

BACKGROUND OF THE INVENTION

1. Field of the Invention

This invention relates to the manufacture of integrated circuit devices. In particular, it relates to a system for connecting metallic leads to a semiconductor chip.

2. Prior Art

In the manufacture of semiconductor devices, the connection of metallic leads to individual chips remain a significant manufacturing problem. Typically, a large number of metallic interconnections must be coupled to an individual chip about its perimeter. One technique known in the technology is tape automatic bonding (T.A.B.) which utilizes a roll-type film cut to form an individual set of chip I/O leads. This individual set is formed by utilizing etch techniques to obtain a personalized lead pattern which conforms to a given chip terminal pattern (footprint). The etch pattern is used to create a large number of identical sets. An individual set is then introduced at the bonding station for affixation. The individual terminal ends of the leads are then coupled using thermal compression or AuSn bonding to the chip. All leads are connected to the chip simultaneously and by utilizing a continuous reel transport process system throughput is enhanced. Thus, T.A.B. is used to facilitate very high production rates for coupling a number of identical chip I/O's to outer circuitry.

A second known technique is wire bonding which, in contrast to T.A.B., is labor intensive. Wire bonding is advantageous since it affords flexibility in the placement of individual wires. The bonding tools can be used irrespective of the chip footprint. This is in contrast to the inflexibility of T.A.B. where a given footprint etched in the tape is tailored for a specific footprint of a chip. Thus, the tooling for bonding a particular chip is dedicated for that chip size and lead pattern. It has no other utilization. Wire bonding techniques while slower in overall production speed can be tailored to accommodate disparities in chip configuration. Given these two known techniques, T.A.B. is generally applied to very high production runs relative to wire bonding.

A second disadvantage of T.A.B. is the long lead time necessary to obtain photoprocessed and etched full tape, personalized to a specific chip configuration. Additionally, quality control problems exist in T.A.B. systems. Such problems occur given variations in film thickness, etching, and actual bonding on a lead-by-lead basis. Additional problems arise in the storage, handling and transportation of pre-personallized foil tape.

Within the prior art, various subsystem components describe individual facets of these two techniques. For example, U.S. Pat. No. 3,698,075 and U.S. Pat. No. 3,709,424 disclose techniques of ultrasonic bonding of a sheet of personalized sheet structures to contact pads on a chip. Specifically, U.S. Pat. No. 3,698,075 provides a sheet metal strip having a large number of identical lead frame sections which are broken away as the sheet is unwound. The strip has a number of leads configured to match bonding pads on a chip. The strip is placed on a mounting pedestal and the chip then placed face down so that the bonding pads contact the leads. Bonding takes place utilizing a needle which is ultrasonically stimulated.

U.S. Pat. No. 3,709,424 also employs a continuous sheet having a plurality of lead structure sections which are placed over a chip mounted on a pedestal. The pattern is personalized for the lead structure of the particular chip. Bonding occurs either by the application of heat or utilizing an ultrasonic transducer contacting each bonding point.

Computer control for the placement of lead wires is disclosed in U.S. Pat. No. 3,737,983. Specifically, the system utilizes a series of chucks which are indexed to various work stations. The work stations contain wire loading devices, an alloy station for placing semiconductor devices in a predetermined orientation on the head of one of the wire leads and a series of automatic bonding stations for connecting the base and emitter contacts of the semiconductor devices to the head of the other wire leads. The system operates under computer control having a general purpose digital computer which is programmed to monitor operation at various stations and locate any chuck which is defective so that the production process does not continue for defectively fabricated device.

Other prior art relating to the production of semiconductor devices, and in particular, lead structures and their bonding to integrated circuit chips are found in U.S. Pat. Nos. 3,395,447; 3,544,857; 3,698,074; 3,793,714; 3,846,905; 3,859,715; 3,859,718; and 4,079,509. While this prior art defines various steps, in none is there any integrated process for fabricating personalized leads used for tape bonding and, bonding those leads to a particular chip. The ability to vary either the pattern cut from the metal tape on a real time basis for a particular chip or to personalize the bonding for the unique geometry of that chip is not found within the prior art germane to the manufacture of integrated circuit structures.

Computer controlled cutting systems, for example, in the manufacture of garments, are known where the cutting operation is in response to a stored program. For example, U.S. Pat. No. 3,761,675 and 4,178,820 are directed to computer controlled techniques for cutting pattern pieces from computer generated markers. The '675 patent utilizes a laser cutting system wherein the cutting tool is under computer control having stored therein a program indicative of the particular marker. The pattern data is fed to the computer which then organizes the pieces within a sheet to minimize selvage. This orientation of the pieces, the marker, is then stored and the outlines are utilized to control the cutter's trace. Similarly, the '820 patent utilizes a blade cutter operating under computer control to delineate the cutting path relative to the cutting table.

A hallmark characteristic of both of these systems is that the patterns which are cut define components of an overall apparel pattern. Those individual components following cutting are separated from the selvage and are then individually assembled into the completed garment. Thus, while computer control is utilized for initial cutting of components, all fabrication steps following the actual cutting process are accomplished by hand. Other computerized cutting systems are found in U.S. Pat. Nos. 3,490,320 and 3,761,675. Also, the particular marker is dedicated to one garment.

Thus, within the prior art, broadly pertinent to the concepts of cutting a required pattern from a strip of material within the art related to pattern cutting, once the components have in fact been produced from the strip they must then be assembled by hand. Within the technology specifically germane to the fabrication of semiconductor elements, there is no such personalization at either the cutting step or the bonding step. Rather, a repetitious pattern is created in T.A.B. techniques and repetitious bonding utilizing dedicated tools occurs at a subsequent station. Thus, to the extent that computer control techniques are utilized, they are inflexible and dedicated to a given footprint of the bonding conductors dedicated to a specific chip footprint.

SUMMARY OF INVENTION

Given the shortcomings of the prior art, it is an object of the present invention to define an improved system for forming a semiconductor device wherein personalization occurs at both the step of pattern cutting and at the step of bonding.

Another object of the present invention is to utilize tape automated bonding materials in a personalized system.

A still further object of the present invention is to define a system by which patterns personalized to a variety of chips can be cut utilizing a single set of cutting tools and that bonding of such patterns to individual chips can be accomplished utilizing a single set of bonding tools.

These and other objects of this invention are accomplished in a method of forming semiconductor devices wherein a continuous sheet of material suitable for forming leads is provided and continuously moved to a cutting station. The material may be an aluminum foil or conventional tape automated bonding materials. A cutting tool, typically a laser, is provided at the cutting station. By computer control, the laser is guided to form a personalized footprint for the chip to which it is to be bonded. Thus, the cutting of a preselected pattern in the strip occurs at the cutting station directly responsive to computer program control.

The strip then having the pattern cut therein is moved to a bonding station where it is aligned with the chip. A bonding tool is provided acting under computer control so that respective leads are affirmatively bonded sequentially to bumps provided on the chip and then, if required subsequently to a lead frame or a substrate. The bonded frame can be severed from the selvage. Thus, by this technique, computer controlled personalization of a pattern and bonding occur providing increased flexibility in the production system.

This invention will be described in greater detail by referring to the attached drawings and the description of the preferred embodiment that follows.

BRIEF DESCRIPTION OF THE DRAWINGS

FIG. 3A is a schematic perspective view showing the techniques of a bonding step of a chip/foil assembly to a substrate;

FIG. 3B is a schematic perspective view showing an alternative second bonding step of a chip/foil assembly to a lead frame; and FIG. 4 is a side elevation view showing an example of a clad metal tape which may be used in the practice of the present invention.

DESCRIPTION OF THE PREFERRED EMBODIMENT

Figure 1:
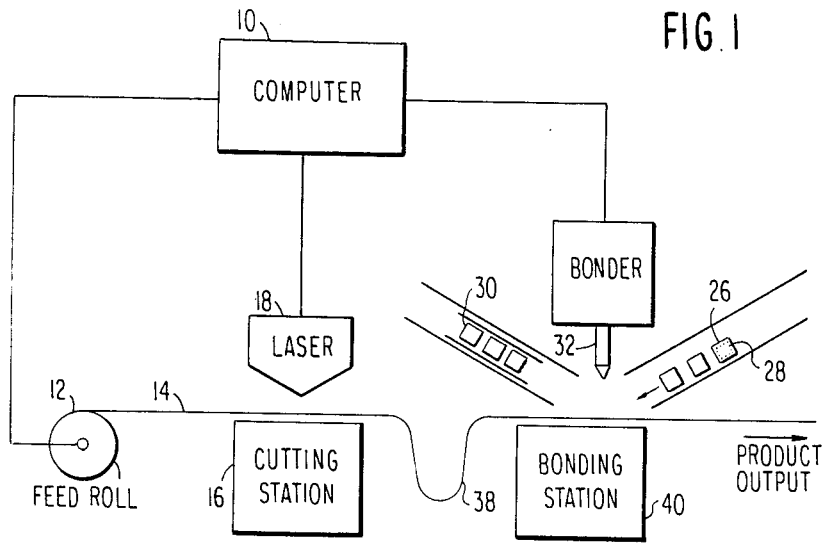
FIG. 1 is a diagram showing the basic system elements of the present invention.

In accordance with the present invention, chips to be bonded utilizing T.A.B. techniques have a plurality of bumps provided about the periphery of the active chip area. These bumps are elevated lands which are placed on the perimeter to accomplish the connection of the chip to the metal lead without fracturing passivation or creating short circuits in the chip.

Typically chip bumping is done by plating techniques. Such conventional bumps are shown, for example, in U.S. Pat. No. 3,709,424 as contact pads 19 spaced on a semiconductor body.

While the present invention may utilize bumps formed by plating techniques, a significantly improved technique offers unique advantages. That is, by utilizing evaporative methods a metal bump may be formed under controlled conditions with extreme accuracy. For example, the bump may have a diameter in the range of 0.125 mm and an acceptable thickness in the range of 0.0175–0.375 mm. The metal selected for evaporation is approximately 1,000 Å Cr with an aluminum bump.

In addition to the bumps which must be provided as the bonding surfaces on the chip, a second essential aspect of the present invention is the tape used for T.A.B. Within the prior art, conventional materials employ copper in combination with gold or tin coating and are attached to a substrate material, such as Mylar TM or a polyimide. The present invention while capable of utilizing those materials departs from the prior art by employing blank aluminum foil. The aluminum foil is not treated by etching although in high volume circumstances, such can be accomplished. It is known, however, that pre-etching to a given footprint constrains flexibility in the system yet increases shelf life, storage and handling problems. In accordance with the present invention, the aluminum tape is cut by a laser from a blank roll of aluminum foil immediately prior to bonding. Hence, the cut foil is not stored and not subjected to offline handling.

A third significant element in the practice of the present invention is the technique by which bonding occurs. Tape automated bonding generally utilizes a process wherein a thermal probe assembly is employed such that all bonding of inner leads occurs simultaneously. In contrast, wire bonding techniques proceed on a wire-by-wire basis as the probe feeds wire from a spool. Thus, in wire bonding techniques, the probe must move in a manner such that the inner bond, wire feed and wire dressing, and outer bond are done in a particular sequence. Thus, the probe must traverse the entire length of the wire for each wire so bonded. Typical lengths are in the range of 3–5 mm so that the bonding of each wire is a relatively time consuming step. In accordance with the present invention, ultrasonic bonding techniques are utilized wherein the personalized laser cut aluminum foil is suspended over and aligned to the chip bumps. Since no wire must be fed, a single probe accurately and rapidly steps from one lead end point to another lead end point, typically a distance of 0.2 mm. Thus, the rate at which ultrasonic bonding occurs utilizing a single tool is in the order of 5–10 times faster than wire bonding utilizing the same tool. While it is acknowledged that this bonding step is slower than the simultaneous T.A.B. techniques, it is dependent on the I/O count.

Nevertheless, a single tool may be used for an infinite variety of personalized wiring patterns.

Referring now to FIG. 1, a schematic drawing of the system in accordance with the preferred embodiment of this invention is shown. The entire system is under the control of a computer 10 which monitors all system functions. The computer may be a general purpose multi-processor, such as an IBM Series 1. The computer contains stored therein appropriate system programming to define both the personalization for the tape as well as the bonding sequence for a variety of lead and chip patterns. It will be appreciated by those known in this technology that a variety of commercially available systems may be employed as suitable data processors.

A feed roll 12 contains a supply of aluminum foil stock. The aluminum foil 14 is fed in a conventional manner (sprocket belt or roller drive or the like) to a cutting station 16 utilizing a laser cutter 18. At the cutting station, a laser is directed by two basic system commands from the computer 10. First, programmed signals for the finger positions of the leads as dictated, by the chip footprint bond alignment requirement are inputted by an operator as a system input. Secondly, a set of programmed parameters or "ground rules" are stored.to be used as appropriate lead dimensions, spacings, termination points and the like. Thus, the laser 18 operating in conjunction with the downstream bonding station creates a personalized tape just prior to the bonding step. Buffer loop 38 is used to accommodate differences in cutting and bonding rates. While preferred, the loop is not required.

In accordance with the present invention, this personalized tape is created by lasing the blank tape 14 from the spool 12. Thus, for a particular chip footprint, an individual pattern is created. Registration is achieved in the case of roll stock by using sprockets and sprocket holes 15 on the marginal edges of the tape analogous to photographic film. It is also apparent that individual sheets from a feed hopper can also be used.

In formation of the lead pattern, the foil may remain stationary while the laser scans the cutting table. Alternately, the foil can be indexed while the table and/or the laser operate in and X-Y cutting table sequence. Such techniques are well known in computerized cutting systems.

Figure 2:
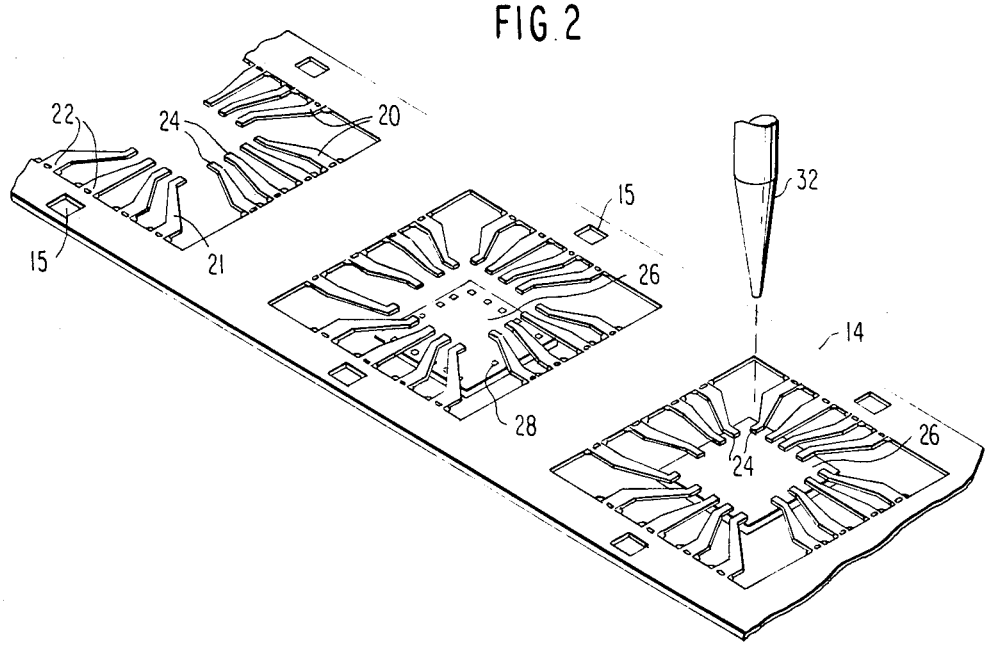
FIG. 2 is a schematic perspective view showing an example of a laser personalized T.A.B. tape, its placement over a chip and a first bonding step.

Referring now to FIG. 2, a perspective view of such a personalized tape is shown at the bonding Station 40. It is understood that the personalization occurs while the tape remains on the selvage and it is subsequently separated after bonding to the chip or if required, after bonding to substrate or lead frame occurs. (FIGS. 3A, 3B) Thus, as shown in FIG. 2, the personalized tape 14 arriving at the bonding station has a plurality of lead structures 20, formed therein. Each of the lead structures comprises a plurality of inwardly extending members formed from the conductive lead material. As shown in FIG. 2, the inwardly extending members 20 have intermediate zones 21 and tapered portions 24 which terminate in a spaced inner relationship in a contact area. Zone 22 is where selvage separation will occur. As shown, in this zone the inwardly extending members 20 have perforations to assist in separation.

A semiconductor body 26 (FIG. 3) has a series of bumps 28 as previously described. The inner tapered portions 24 are configured during personalization to be adapted to and aligned with the bumps 28. The semiconductor body is disposed under the foil 14.

Thus, when the tape 14 is fed to the bonding station 40, from the buffer loop 38 the personalized aluminum tape is aligned with a chip 26 which in turn is placed on a substrate 50 or lead frame 30. FIG. 1 illustrates the feeding of lead frames 30; substrates would be supplied in the same manner. With those three components aligned in the bonding station, as shown in FIG. 2, an ultrasonic probe 32 under control of the computer 10 steps sequentially from one lead end point 24 to another to perform ultrasonic welding of an individual bump 28 to an individual lead. This is a first bonding step.

In this manner, the automation advantages of T.A.B. are attained, yet at the same time, the step spot ultrasonic welding technique can be used via a generic tool not dedicated to any particular pattern. Given this operation, a bumped chip can be integrated in such a manner that low-volume T.A.B. is accomplished in an economic manner commensurate with that of high-volume T.A.B. techniques. The invention offers attendant advantages in that productivity over wiring bonding techniques occurs with increased reliability.

Importantly, in accordance with the present invention, no planning or waiting is required to form a multitude of dedicated personalized tapes. The personalized tapes need not be handled or stored prior to utilization. Rather they are utilized in the subsequent manufacturing step.

As shown in FIG. 2, the ultrasonic probe 32 is stepped from lead to lead without having to traverse the full length of the wire as previously practiced in wire bonding techniques. Ultrasonic probe stepping has been demonstrated as being programmable on a disc-type memory system. Such techniques are known in conventional auto-bonding systems. By computer control, the same stored memory techniques are utilized such that the bump pattern on the chip is known and the probe is stepped from one bump to another to accomplish bonding in a systemic manner. While a single bonding head is illustrated, it is apparent that multiple heads may be used.

A second bonding step may also be employed at the bonding station. It may be either the chip/foil assembly to a substrate (FIG. 3A) or, to a lead frame (FIG. 3B). In both cases the first bond fixes the terminal ends 24 to the chip bumps 28. Then, as shown in FIG. 3A the substrate 50 is placed under the chip/foil assembly. Portions 22 are bonded by probe 32 to pads 52 disposed on the substrate. Separation of the selvage may occur prior to or after this second bond. In a corresponding manner, bonding may be to a lead frame. As shown in FIG. 3B a lead frame 30 is placed under the chip/foil assembly. Bonding of the terminal portion 22 to leads 31 occurs. Substrates or lead frames are supplied to the bonding station in a conventional manner.

Following bonding, the product is released from the bonding station and the bonded assembly if required is then separated from the selvage. The selvage may then be recycled and the bonded chip assembly removed for subsequent processing. Alternatively, the bonded assembly may be rolled and stored intact without separation from the selvage.

While aluminum foil tape is a preferred material, other tapes may be used. For example, a clad metal tape may be used in a situation where it is desired to alternate the outer lead bond such as soldering where copper, for example, would be preferable. This technique is applicable to a wide variety of substrate-lead frames and formats. Such a clad metal is shown in FIG. 4 and represents one of many available formats. This structure is applicable to gang solder reflow processes.

FIG. 4 illustrates in plan view a clad metal tape 14 having an aluminum inlay 42 disposed at the finger area. This aluminum inlay is disposed in the area where ultrasonic bonding takes place. A copper base metal 34 is disposed at the outer bond area for solder bonding. Optionally, a solder strip 36 may be used along the outer edge of the tape.

The present invention therefore offers important advantages over conventional T.A.B. or wire bonding techniques. It allows the integration of bumped chips utilizing personalized tape of aluminum or other adaptable clad structure cut from a blank metal. By utilizing a laser system, personalization on a computer controlled basis is immediately tailored to the bump configuration on the chip. Thus, the laser cutter is a generic tool which can be adapted under computer control to cut any desired pattern. Similarly, the step spot ultrasonic bonder is also a generic tool for accomplishing a step-by-step bonding more expeditiously than used in previous wire bonding techniques. The use of a single probe offers important economic advantages since the probe can be used to step bond any personalized tape finger configuration under appropriate computer command.

While this invention has been described relative to its preferred embodiment, it is apparent that modifications of this subject matter can be practiced without departing from the essential scope of this invention. For example, using multiple heads in addition to processing one assembly, parallel bonding of different patterns can be accomplished under common computer control. Similarly multiple patterns may be cut in parallel from a width of foil using multiple laser cutters. Multiple cuts may also be made in stacked foils.

What is claimed is:

1. A method of interconnecting semiconductor devices comprising:
    providing at least first and second semiconductor chips having no predefined sequence for bonding;
    providing a sheet of a material suitable for forming into metallic leads;
    moving said sheet of material to a cutting station having a cutting tool operable under control of a computer;
    cutting patterns having no predefined sequence in said sheet at said cutting station by directing movement of said cutting tool in response to control signals from said computer to trace one or more first patterns in said sheet that is personalized for said first semiconductor chip and subsequently moving said cutting tool under computer control to trace one or more second patterns in said sheet that is personalized for said second semiconductor chip and different from said first patterns such that said patterns are created on demand by said cutting section;
    moving said one or more first and second patterns in said material to a bonding station having a bonding tool operable under control of said computer;
    bonding at least one of said first patterns to said first semiconductor chip and bonding at least one of said second patterns to said second semiconductor chip at said bonding station under control of said computer to form a semiconductor chip assembly; whereby
    patterns personalized to respective semiconductor chips can be created and bonded utilizing a single set of cutting and bonding tools.

2. The method of claim 1 further comprising the step of separating said pattern bonded to said semi-conductor chip assembly from said sheet.

3. The method of claim 1, wherein the step of bonding further comprises the steps of placing said first semiconductor chip and said pattern on a lead frame, positioning said lead frame into alignment with a terminal portion of said pattern unique to said lead frame and, bonding said terminal portion to leads of said lead frame.

4. The method of claim 1, wherein the step of bonding further comprises the steps of placing a substrate under said semiconductor chip and said pattern, positioning said substrate into alignment with a terminal portion of said pattern unique to said substrate and, bonding said terminal portion to contacts on said substrate.

5. The method of claim 1, wherein said semiconductor chip has a series of terminals, and the step of bonding comprises moving said bonding tool from one terminal to another to consecutively bond said pattern to said terminals without tracing said pattern.

6. The method of claim 1, wherein the step of bonding comprising moving said bonding tool under computer control to bond said first pattern to said first chip and subsequently moving said bonding tool under computer control to bond said second pattern to said second chip.

7. The method of claim 1, wherein said cutting tool is a laser cutter.

8. The method of claim 1, wherein said bonding tool is an ultrasonic probe.

9. The method of claim 1, wherein said sheet material is aluminum foil.

10. The method of claim 1, wherein said sheet material is a clad foil having a metal inlay on one side for bonding to said chip and a terminal strip on the opposite side thereof.

11. The method of claim 1, wherein said sheet is supplied from a continuous roll further comprising the step of segmenting said sheet prior to bonding said pattern to said chip.

12. The method of claim 1, further comprising the steps of storing said semiconductor chip assembly on said sheet.

* * * * *